(12) United States Patent
Chansungsan et al.

(10) Patent No.: US 7,157,947 B2
(45) Date of Patent: Jan. 2, 2007

(54) POWER SUPPLIES NOISE DETECTOR FOR INTEGRATED CIRCUITS

(75) Inventors: Chaiyuth Chansungsan, Aloha, OR (US); Keith Self, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/731,393

(22) Filed: Dec. 9, 2003

(65) Prior Publication Data

US 2005/0122138 A1 Jun. 9, 2005

(51) Int. Cl.
*H03K 4/06* (2006.01)
*H03K 3/02* (2006.01)

(52) U.S. Cl. .................... 327/143; 327/198; 327/78

(58) Field of Classification Search ............... 327/143, 327/198, 50, 62, 68, 70, 77, 78, 79, 80, 81, 327/89; 323/223, 282; 363/39
See application file for complete search history.

(56) References Cited

U.S. PATENT DOCUMENTS 4,622,480 A * 11/1986 Uchimura et al. .......... 327/337
5,629,642 A * 5/1997 Yoshimura ................. 327/142
2001/0018752 A1* 8/2001 Yoshioka et al. ........... 714/47
2002/0105308 A1* 8/2002 Tsukagoshi et al. ........ 323/282
2003/0085765 A1* 5/2003 Mullgrav, Jr. .............. 330/297
2003/0226054 A1* 12/2003 Benno et al. ............... 713/500
2004/0027110 A1* 2/2004 Sue et al. ................... 323/283
2005/0001658 A1* 1/2005 Saito .......................... 327/78

OTHER PUBLICATIONS

Bazes, Mel, "Two Novel Fully Complementary Self-Biased CMOS Differential Amplifiers", *IEEE Journal of Solid-State Circuits, 26(2)*, (Feb. 1991), 165-168.
Buck, A E., et al., "A CMOS bandgap reference without resistors", *IEEE Journal of Solid-State Circuits, 37(1)*, (Jan. 2002), 81-83.

* cited by examiner

*Primary Examiner*—Tuan T. Lam
(74) *Attorney, Agent, or Firm*—Schwegman, Lundberg, Woessner & Kluth, P.A.

(57) ABSTRACT

In some embodiments, a circuit includes a reference current source to provide a substantially noise free current signal, and a detector coupled to one or two power supplies. In some embodiments, a method includes receiving a substantially noise free current signal, receiving one or two power supply signals, processing the substantially noise free current signal and the one or two power supply signals to detect a noise signal in the one or two power supply signals, and generating a noise detection signal in response to detection of the noise signal.

23 Claims, 7 Drawing Sheets

POWER SUPPLIES NOISE DETECTOR FOR INTEGRATED CIRCUITS

FIELD

This invention relates to circuits. More particularly, this invention relates to semiconductor chip on-die power supplies, positive and ground (or negative), noise detector circuits.

BACKGROUND

Noise detector circuits are used in a variety of applications. Many noise detector circuits have been developed. Some noise detector circuits were developed for detecting noise on power lines. Other noise detection circuits were developed for detecting noise on radio signals. Unfortunately, many noise detector circuits designed to detect noise on power lines are not suitable for detecting noise signals that interfere with the operation of modem integrated circuits. Also, many noise detector circuits designed for detecting noise on radio signals are designed to detect noise only above a fixed threshold.

DESCRIPTION

Figure 1:
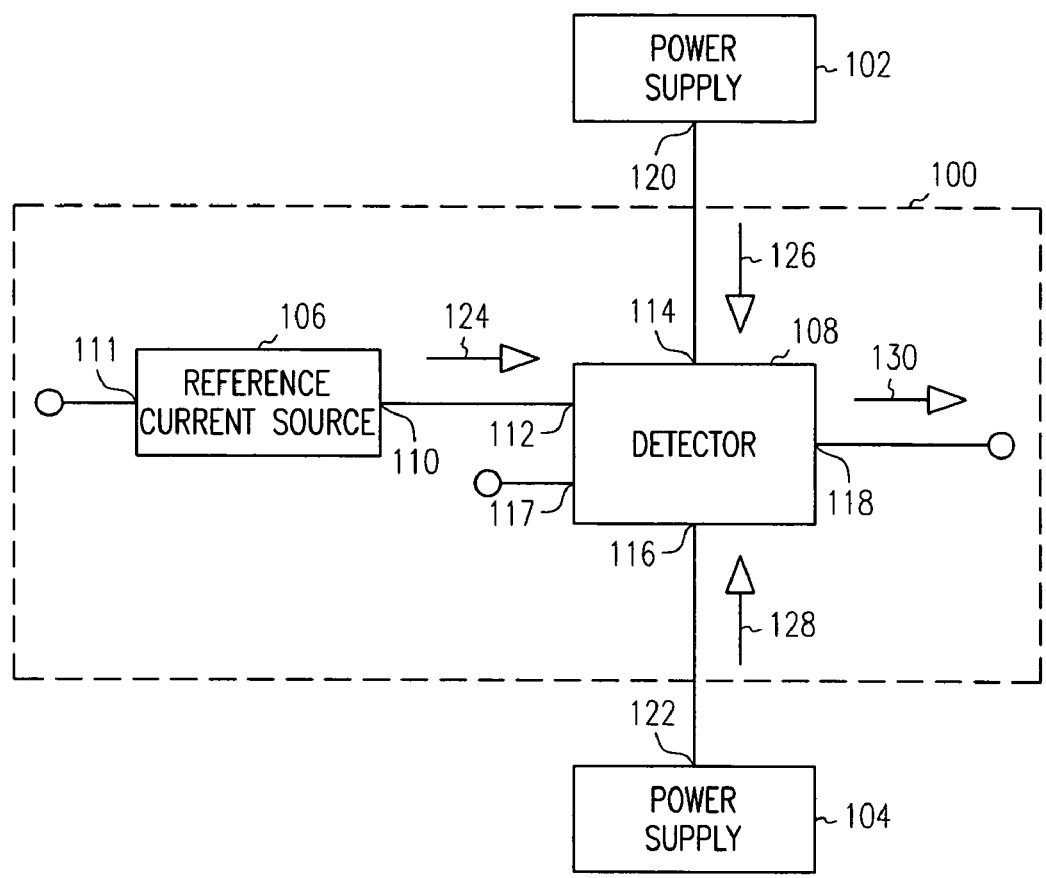
FIG. 1 is a block diagram of power supplies, positive Vcc and ground (or negative) Vss, and a circuit including a reference current source and a detector to detect a noise signal on the power supplies in accordance with some embodiments of the present invention.

In the following description of some embodiments of the present invention, reference is made to the accompanying drawings which form a part hereof, and in which are shown, by way of illustration, specific embodiments of the present invention which may be practiced. In the drawings, like numerals describe substantially similar components throughout the several views. These embodiments are described in sufficient detail to enable those skilled in the art to practice the present invention. Other embodiments may be utilized and structural, logical, and electrical changes may be made without departing from the scope of the present invention. The following detailed description is not to be taken in a limiting sense, and the scope of the present invention is defined only by the appended claims, along with the full scope of equivalents to which such claims are entitled.

FIG. 1 is a block diagram of power supplies, positive Vcc and ground (or negative) Vss, 102 and 104 and a circuit 100 including a reference current source 106 and a detector 108 to detect a noise signal on the power supplies 102 and/or 104 in accordance with some embodiments of the present invention. The reference current source 106 includes an output port 110 and an input port 111 from a control source (not shown). The detector 108 includes input ports 112, 114, and 116, and 117 from a control source (not shown) and an output port 118. The power supplies 102 and 104 include output ports 120 and 122, respectively. The input port 112 of the detector 108 is coupled to the output port 110 of the reference current source 106. The input ports 114 and 116 of the detector 108 are coupled to the output ports 120 and 122 of the power supplies 102 and 104, respectively.

The power supplies 102 and 104, in some embodiments, are power supplies, such as voltage power supplies used to provide power to integrated circuits. The power supplies 102 and 104 are not limited to power supplies that provide a particular voltage value. Any voltage values suitable for use in connection with providing a voltage to an integrated circuit are suitable for use in connection with the circuit 100

The detector 108 is not limited to a particular type of detector. Any detector capable of detecting a noise signal is suitable for use in connection with the circuit 100. In some embodiments, the detector 108 detects positive noise signals. In some embodiments, the detector 108 detects negative noise signals. In some embodiments, the detector 108 detects positive and negative noise signals.

In operation, the detector 108 receives a substantially noise free reference current signal 124 and noise signals 126 and 128 (when present on the power supplies 102 and 104). The substantially noise free reference current signal 124 is received from the reference current source 106. The noise signals 126 and 128 are received from the power supplies 102 and 104, respectively. In response to the noise signals 126 or 128, the detector 108 provides a noise detection signal 130 at the output port 118.

Figure 2:
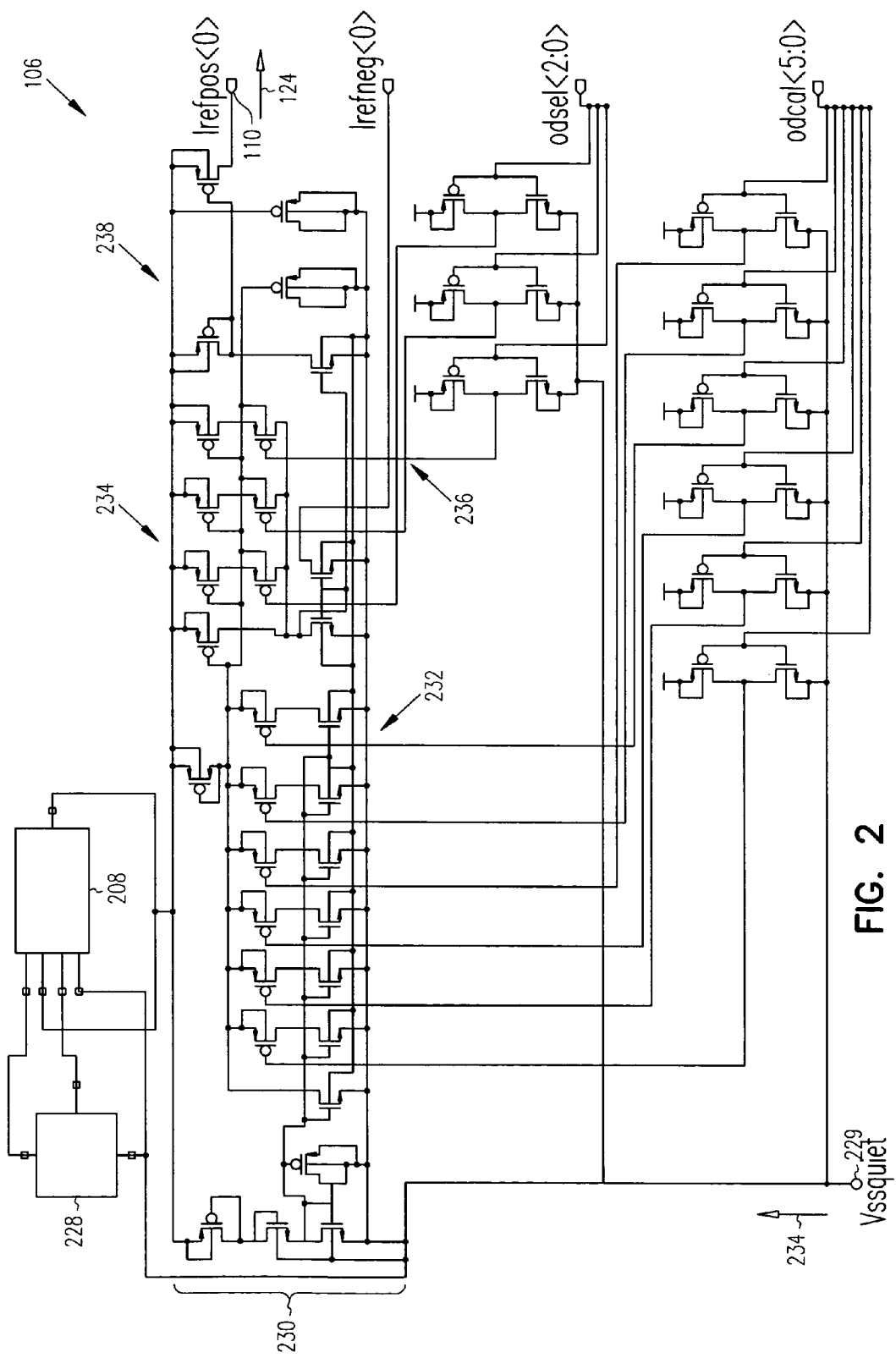
FIG. 2. shows the circuit diagram of the self-referenced on-die power supply noise (droop) detector (SODDD) reference current source, shown in FIG. 1, in accordance with some embodiments of the present invention.

FIG. 2. shows the circuit diagram of the self-referenced on-die power supply noise (droop) detector (SODDD) reference current source 106, shown in FIG. 1, in accordance with some embodiments of the present invention. The reference current source 106 generates the substantially noise free current signal 124 at the output port 110. A bandgap voltage reference unit 228, BANDGAP, described in "A CMOS Bandgap Reference Without Resistors" A. E. Buck et. al., IEEE Journal of Solid-State Circuits, vol. 37. No.1, January 2002, generates a temperature-insensitive voltage reference and bias voltage for the voltage follower differential amplifier 208, DIFFAMP2. Using a dedicated, substantially noise free ground reference 229, VSSQUIET, shielded and routed from the mother board power ground plane (not shown), for the reference current source 106, the generated output of the voltage follower differential amplifier 208, DIFFAMP2, is a power-supply-noise and quasi-temperature insensitive. It provides a bias voltage for a stack 230 of three diodes, PMOS-NMOS-NMOS. The output of the stack 230 is used by NMOS current scalers 232 to generate a selectable bias voltage for PMOS current scalers 234, by way of digital control inputs, odcal<5:0>, for the purpose of calibration. The output current of the programmable (via odsel<2:0>) PMOS current scalers 234 is, then, mirrored by NMOS current mirror 236, whose current is, in return, mirrored by PMOS current mirror 238 to generate the substantially noise free differential reference current pairs. A clean differential reference current pair is used by the detector 108 (shown in FIG. 1). The digital codes, odcal<5:0>and odsel<2:0>, are used for mismatches and process-voltage-temperature (PVT) calibration, and noise-level selection of the SODDD, respectively. They are not limited to six bit and three bit, and the reference current pairs are not limited to one (Irefpos <0> & Irefneg<0>), as shown here. More reference current pairs can be generated by adding more NMOSs and PMOSs to NMOS current mirror 236, and to PMOS current mirror 238, respectively.

The substantially noise free ground reference 229, VSSQUIET, provides a ground voltage signal 234 that is substantially free of noise. For example, the substantially noise free ground reference 229, VSSQUIET, does not receive noise signals such as those in the detector 108, shown in FIG. 1.

In operation, the reference current source 106 provides the current signal 124 at the output port 110. The reference current source 106 uses the ground voltage signal 234, which is substantially noise free, to provide the current signal 124, which is substantially free from ground noise. For substantially positive power-supply Vcc noise free, the bandgap voltage reference 228 provides a voltage and a bias voltage to the voltage follower differential amplifier 208, which provides a voltage reference that is substantially free from positive power supply Vcc noise, to the PMOS-NMOS-NMOS diode stack. The voltage reference is also substantially temperature and loading insensitive. The diode stack provides a bias voltage, which is substantially positive power-supply Vcc noise free, to the controllable NMOS current scalers 232. The controllable NMOS current scalers 232 are connected to a PMOS diode load and provide a noise-free bias voltage to calibrate the controllable PMOS current scalers 234. The controllable PMOS current scalers 234 provide current to the NMOS current mirror 236. The NMOS current mirror 236 provide current to the PMOS current mirror 238. Both the NMOS current mirror 236 and PMOS current mirror 238 provide the substantially noise free differential current signal 124 at the output port 110.

Figure 3:
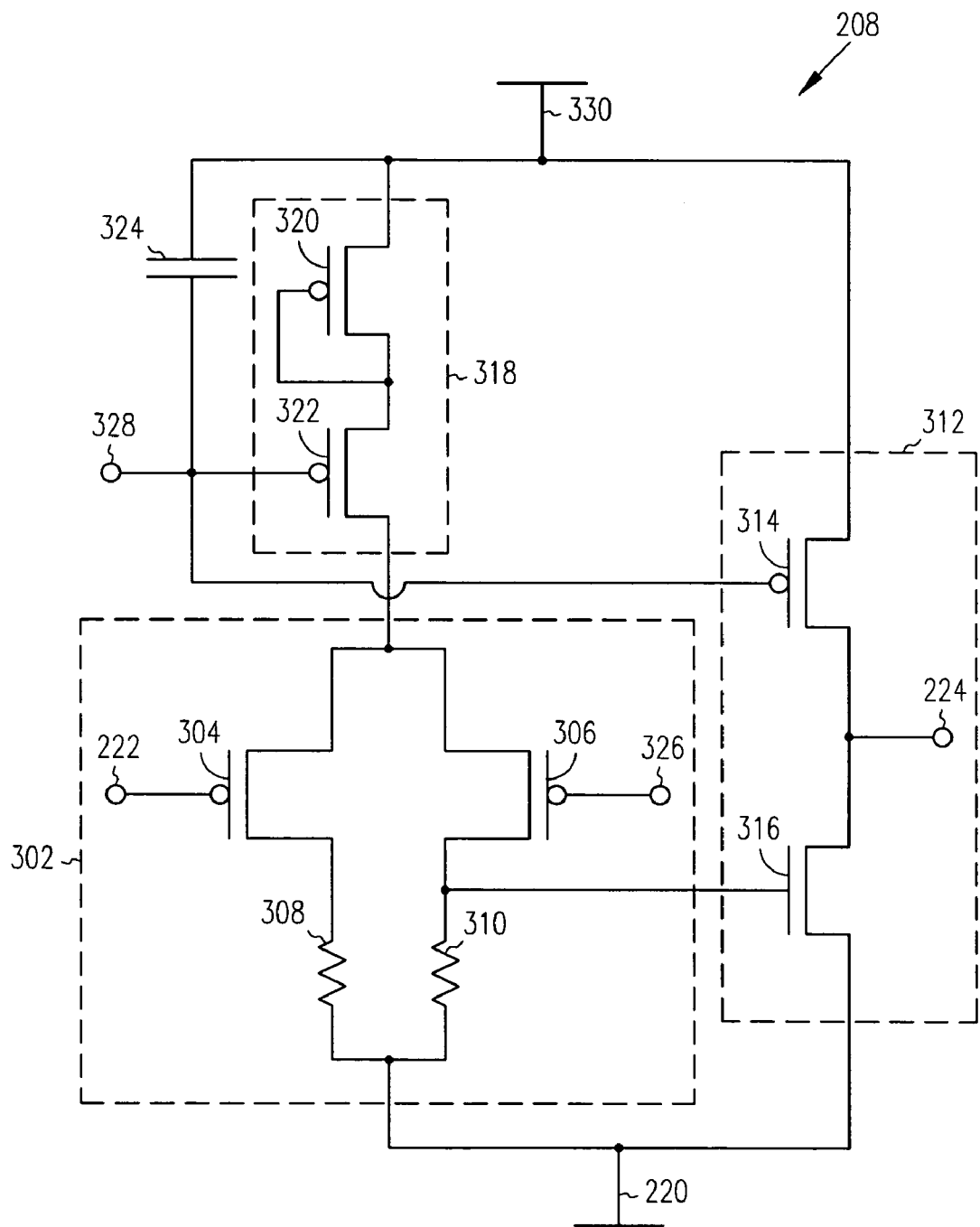
FIG. 3 is the circuit of the voltage follower differential amplifier, shown in FIG. 2, in accordance with some embodiments of the present invention.

FIG. 3 is a schematic diagram of the voltage follower differential amplifier 208, shown in FIG. 2, in accordance with some embodiments of the present invention. The voltage follower differential amplifier 208 includes a differential amplifier 302 including positive metal-oxide semiconductor field-effect transistors (PMOS) 304 and 306, resistors 308 and 310, output circuit 312 including serially connected positive and negative metal-oxide semiconductor field-effect transistors PMOS 314 and NMOS 316, and current source 318 including diode-connected positive metal-oxide semiconductor field-effect transistor 320 connected in series with positive metal-oxide semiconductor field-effect transistor 322, and a capacitor 324 connected to the gates of the metal-oxide field-effect transistor 322 and of the metal-oxide semiconductor field-effect transistor 314 to the positive power supply Vcc. The capacitor 324 reduces noise in the differential amplifier 302. The amplifier 208 also includes the input port 222, an input port 326, the output port 224, input port 220, a voltage bias input port 328, and an input port 330.

Figure 4:
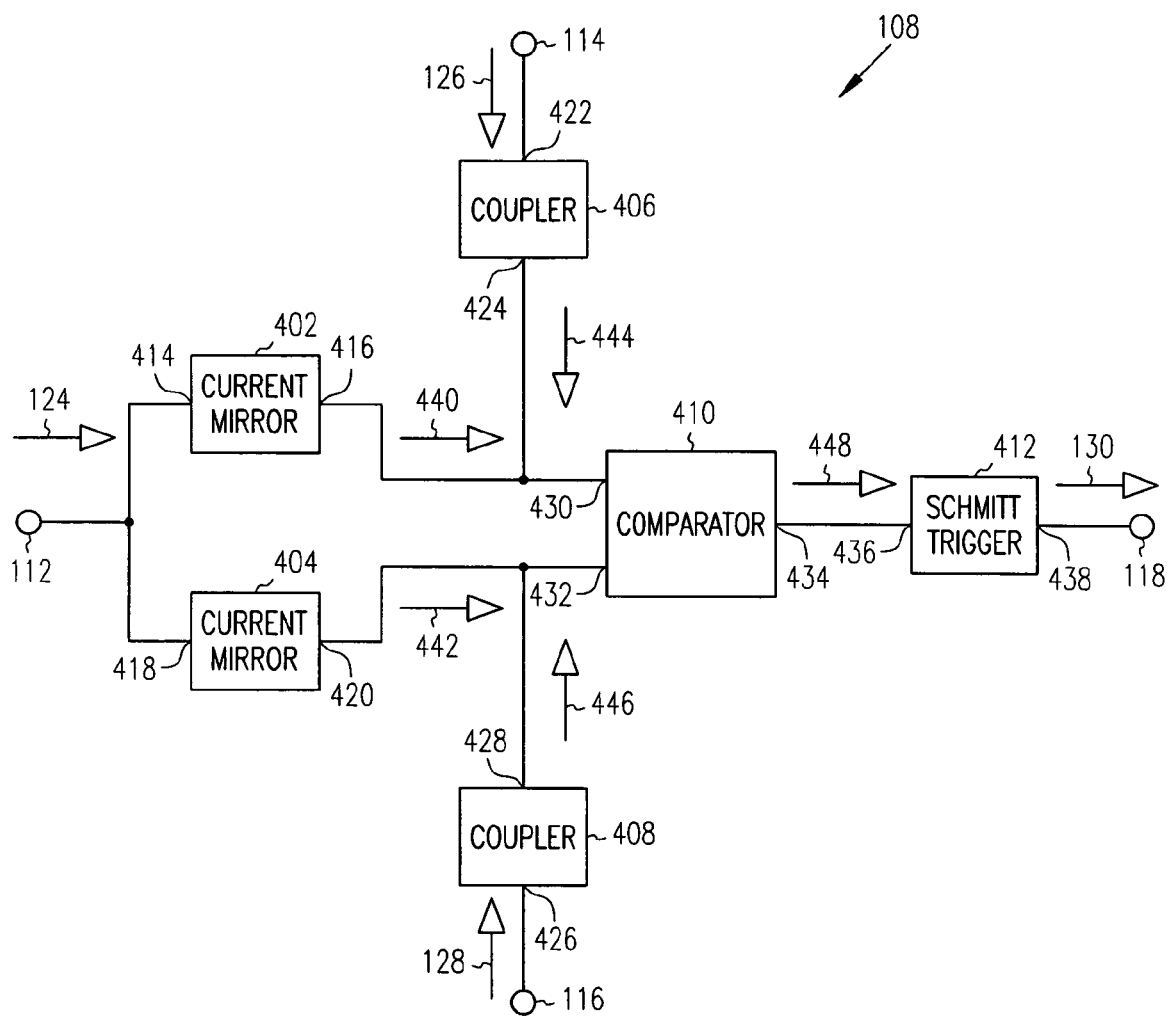
FIG. 4 is a block diagram of the detector, shown in FIG. 1, in accordance with some embodiments of the present invention.

FIG. 4 is a block diagram of the detector 108, shown in FIG. 1, in accordance with some embodiments of the present invention. The detector 108 includes input ports 112, 114, and 116 and output port 118. The input port 112 receives the substantially noise free current signal 124. The input ports 114 and 116 receive the noise signals 126 or 128 (when present), respectively, from the power supplies 102 and 104 (shown in FIG. 1). The detector 108 provides the noise detection signal 130 at the output port 118.

The detector 108 includes current mirrors 402 and 404, noise couplers 406 and 408, comparator 410, and Schmitt trigger 412. The current mirror 402 includes an input port 414 and an output port 416. The current mirror 404 includes an input port 418 and an output port 420. The coupler 406 includes an input port 422 and an output port 424. The coupler 408 includes an input port 426 and an output port 428. The comparator 410 includes input ports 430 and 432 and an output port 434. The Schmitt trigger 412 includes an input port 436 and an output port 438. The input port 414 of the current mirror 402 is coupled to the input port 112 of the detector 108. The input port 418 of the current mirror 404 is coupled to the input port 112 of the detector 108. The input port 422 of the coupler 406 is coupled to the input port 114 of the detector 108. The input port 426 of the coupler 408 is coupled to the input port 116 of the detector 108. The input port 430 of the comparator 410 is coupled to the output port 416 of the current mirror 402 and the output port 424 of the coupler 406. The input port 432 of the comparator 410 is coupled to the output port 428 of the coupler 408 and the output port 420 of the current mirror 404. The input port 436 of the Schmitt trigger 412 is coupled to the output port 434 of the comparator 410. The output port 438 of the Schmitt trigger 412 is coupled to the output port 118 of the detector 108.

In operation, the current mirrors 402 and 404 receive the substantially noise free reference current signal 124 from the reference current source 106 (shown in FIG. 2). The current mirrors 402 and 404 provide mirrored differential reference current signals 440 and 442 to the comparator 410 The couplers 406 and 408 receive the noise signals 126 and 128 (when available) and provide the filtered noise signals 444 and 446, respectively, to the comparator 410. The comparator 410 processes the mirrored differential signals 440 and 442 and the filtered noise signals 444 and 446 to provide a noise detection signal 448 to the Schmitt trigger 412. The Schmitt trigger 412 provides the noise detection signal 130 to the output port 118 of the detector 108.

Figure 5A:
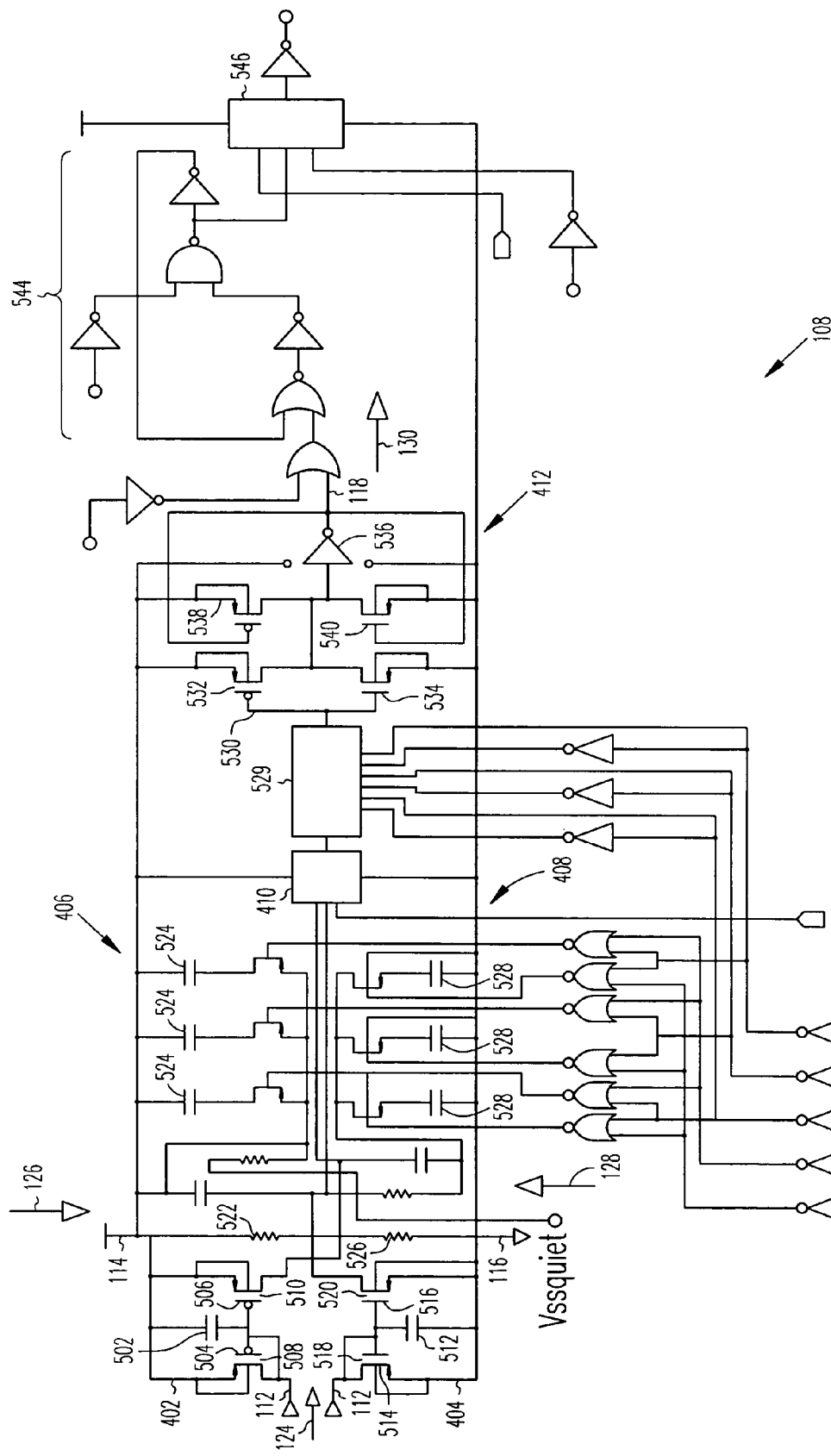
FIG. 5A is the circuit of the detector, shown in FIG. 4, in accordance with some embodiments of the present invention.

FIG. 5A is a schematic diagram of the detector 108, shown in FIG. 4, in accordance with some embodiments of the present invention. The detector 108 includes input ports 112, 114, and 116 and output port 118, and control inputs for only positive supply VCC noise only, or only ground (negative) VSS supply noise only, or both; and for noise frequency-band selection. The substantially noise free Vssquiet is also used. The input port 112 receives the substantially noise free reference current signal 124. The input ports 114 and 116 receive the power supply noise signals 126 and 128, respectively. The noise detection signal 130 is provided at the output port 118. The detector 108 includes the current mirrors 402 and 404. The current mirror 402 includes a capacitor 502 coupled to gates 504 and 506 of positive metal-oxide semiconductor field-effect transistors 508 and 510, respectively. The current mirror 404 includes a capacitor 512 coupled to gates 514 and 516 of negative metal-oxide semiconductor field-effect transistors 518 and 520, respectively. The current mirrors 402 and 404 are coupled to the comparator 410's resistors, 522 and 526. Each noise coupler 406 and 408, is coupled to a resistor, which is connected to the substantially noise free ground Vssquiet. The resistor is coupled to a capacitor, which is coupled to a comparator 410 input, forming a high-pass filter. The noise coupler 406 includes three selectable capacitors 524. The noise coupler 408 includes three selectable capacitors 528. Each capacitor of the couplers 406, 408 can be selected via the corresponding NMOS switch, which is turn on/off by control inputs odflr<2:0>. The selectable capacitors 524, 528 together with the corresponding selectable filter load 529 allow the selection of noises from three different frequency bands: low, medium, and high. The noise frequency bands are not limited to three as in this case. The comparator 410 is coupled to the selectable filter load, which is coupled to the Schmitt trigger 412. The resistors 522 and 526 set an initial bias level at the comparator 410. The capacitors 524 and 528 provide a path to the comparator 410 for noise signals. The Schmitt trigger 412 includes an inverter 530 including metal-oxide semiconductor field-effect transistors 532 and 534 coupled to an inverter 536. The inverter 536 is coupled to metal-oxide semiconductor field-effect transistors 538 and 540. The Schmitt trigger 412 provides hysteresis, that is, one transition level for a low-to-high transition and a different transition level for a high-to-low transition. Those skilled in the art will appreciate that the Schmitt trigger 412 can be followed by logic circuits 544 that control the selection of positive noise signals or negative noise signals. Those skilled in the art will also appreciate that the detection of a noise signal can be saved in memory or latched in a suitable logic circuit 546.

Figure 5B:
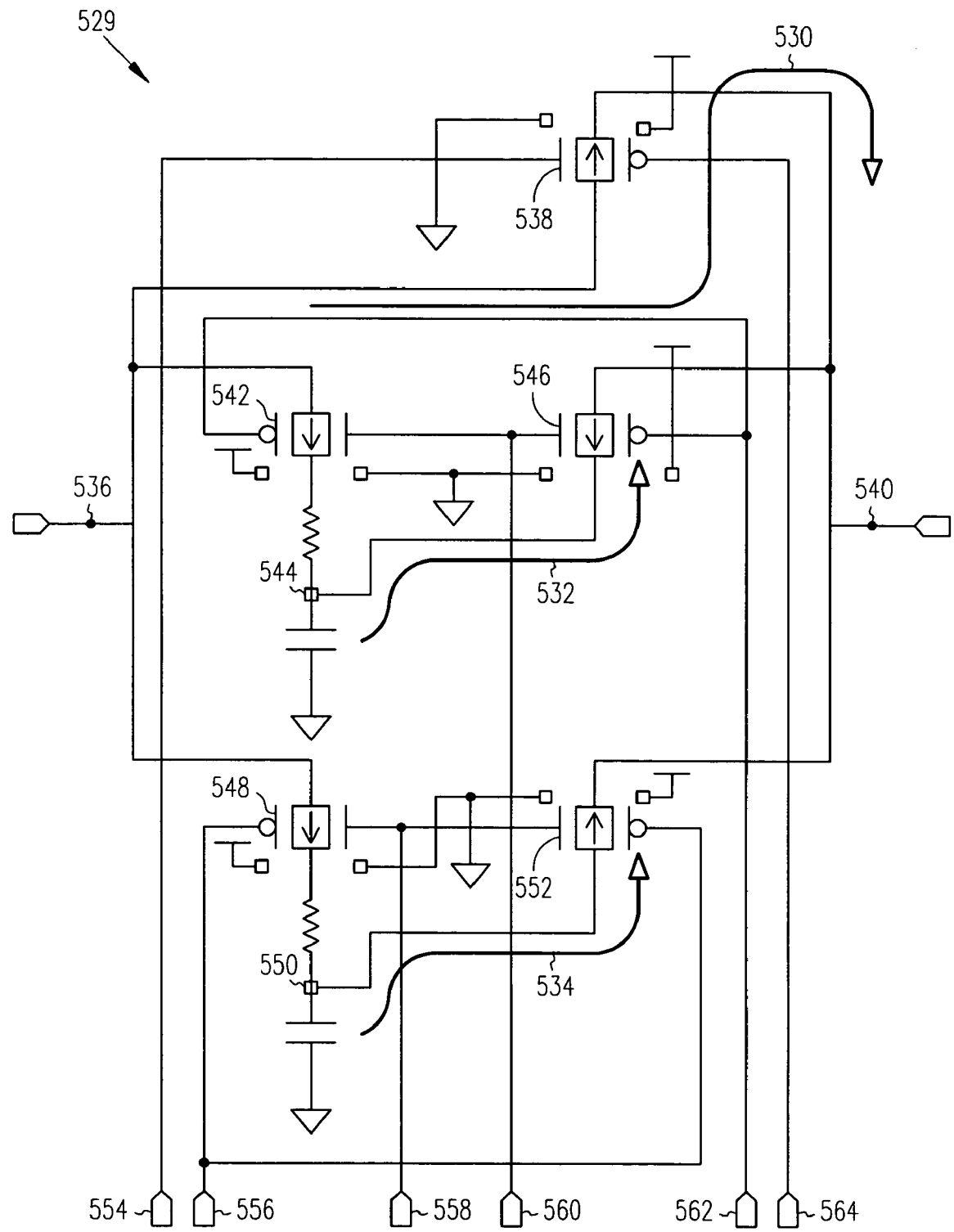
FIG. 5B is the circuit of the filter load shown in FIG. 5A.

FIG. 5B is a schematic diagram of the filter load 529 shown in FIG. 5A. The filter load 529 includes three selectable filter paths 530, 532, and 534. The selectable filter path 530 includes node 536, pass gate 538, and node 540. The selectable filter path 532 includes node 536, pass gate 542, filter 544, pass gate 546, and the node 540. The selectable filter path 534 includes node 536, pass gate 548, filter 550, pass gate 552, and the node 540. In operation, signals provided at control nodes 554, 556, 558, 560, 562, and 564 control selection of the three selectable filter paths 530, 532, and 534.

Figure 6:
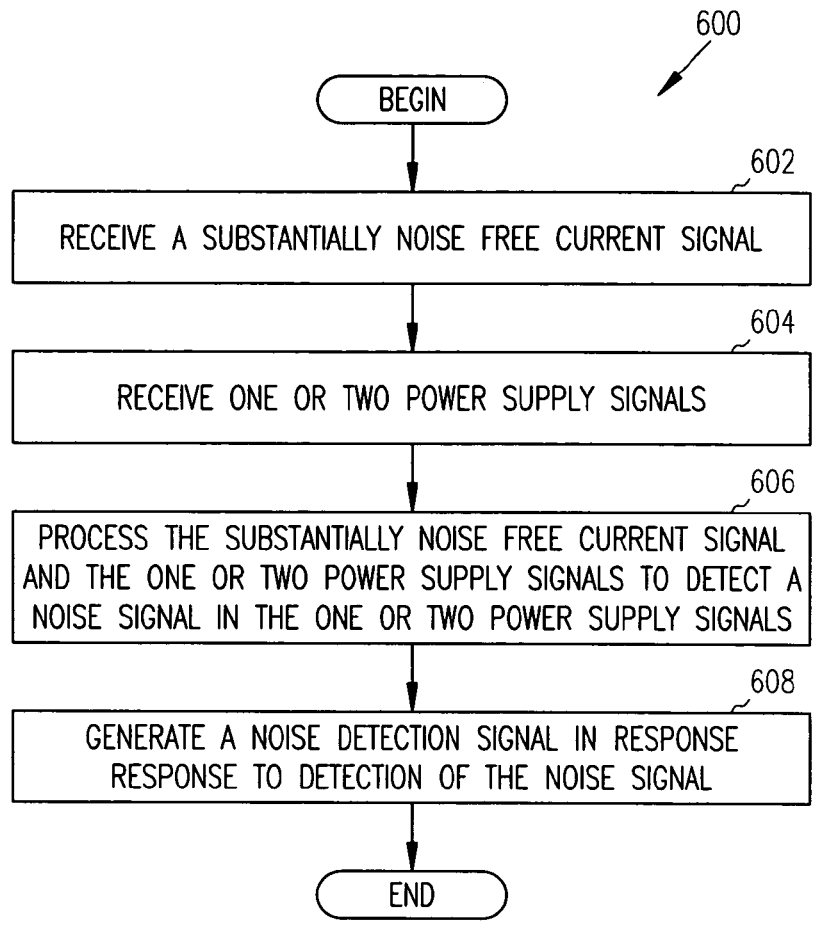
FIG. 6 is a flow diagram of a method in accordance with some embodiments of the present invention.

FIG. 6 is a flow diagram of a method 600 in accordance with some embodiments of the present invention. The method 600 includes receiving a substantially noise free current signal (block 602), receiving one or two power supply signals (block 604), processing the substantially noise free current signal and the one or two power supply signals to detect a noise signal in the one or two power supply signals (block 606), and generating a noise detection signal in response to detection of the noise signal (block 608). In some embodiments, receiving the substantially noise free current signal means receiving a pair of differential complementary current signals. A pair of complementary current signals includes a differential pair of current signals. In some embodiments, receiving one or more potential signals includes receiving at least two voltage signals having different polarities. For example, a positive voltage signals has a positive polarity and a negative voltage signals has a negative polarity, so a positive voltage signal and a negative voltage signals are examples of two voltage signals having different polarities. In some embodiments, processing the substantially noise free current signal and the one or two power supply signals to detect a noise signal in the one or two power supply signals includes comparing the one or two power supply signals to the substantially noise free current signal. Signals can be compared using a comparator circuit. In some embodiments, generating a noise detection signal in response to detection of the noise signal includes generating a digital signal in response to detection of the noise signal. In some embodiments, the method 600, further includes setting a calibration voltage level, and setting a threshold level. A calibration voltage level is a voltage level slightly above the ambient noise in a system. A threshold level is a voltage level that defines the noise threshold. A signal that exceeds the threshold level is considered a noise signal.

Figure 7:
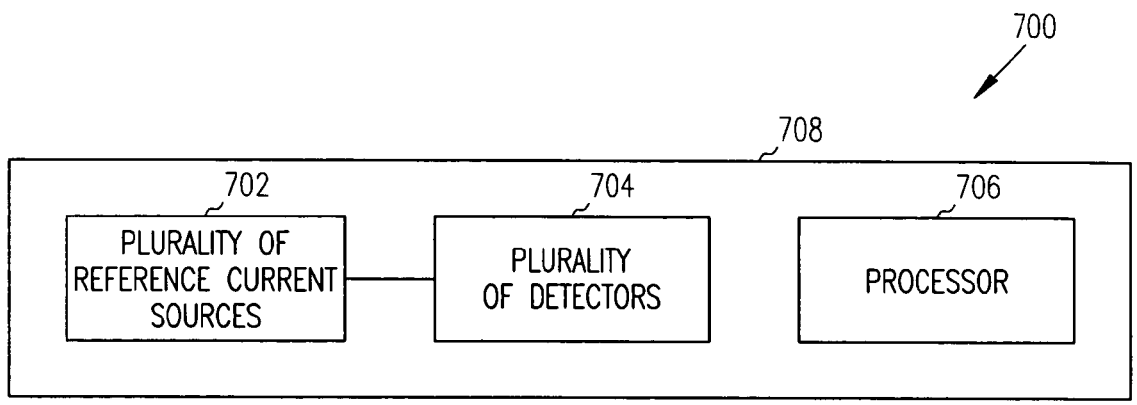
FIG. 7 is a block diagram of a circuit including a plurality of reference current sources, a plurality of detectors, and a processor formed on a substrate in accordance with some embodiments of the present invention.

FIG. 7 is a block diagram of a circuit 700 including a plurality of reference current sources 702, a plurality of detectors 704, and a processor 706 formed on a substrate 708 in accordance with some embodiments of the present invention. The processor 706 is not limited to a particular type of processor. In some embodiments, the processor 706 includes a very-long instruction word processor. The substrate 708 is not limited to being formed from a particular material. In some embodiments, the substrate 708 includes silicon. In some embodiments, the substrate 708 includes gallium arsenide. In some embodiments, the substrate 708 includes germanium.

In operation, each of the plurality of current sources 702 provide a substantially noise free reference current to one of the plurality of detectors 704 coupled to one or two power supplies (shown in FIG. 1). Each of the plurality of detectors 704 detects a noise signal on the one or two power supplies at different location on the substrate 708 and generates a noise detection signal to indicate detection of the noise signal. Thus, the circuit 700 can provide noise signal identification at a plurality of locations on the substrate 708.

If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Although specific embodiments have been described and illustrated herein, it will be appreciated by those skilled in the art, having the benefit of the present disclosure, that any arrangement which is intended to achieve the same purpose may be substituted for a specific embodiment shown. This application is intended to cover any adaptations or variations of the present invention. Therefore, it is intended that this invention be limited only by the claims and the equivalents thereof.

What is claimed is:

1. A circuit comprising:
   a reference current source to provide a substantially noise free differential current signal; and
   a detector coupled to one or two power supplies, the detector to receive the substantially noise free differential current signal, to detect a noise signal on the one power supply or the two power supplies, and to generate a high noise detection signal to indicate detection of the noise signal.

2. The circuit of claim 1, wherein the reference current source comprises a controllable current source.

3. A circuit comprising:
   a reference current source to provide a substantially noise free differential current signal; and
   a detector coupled to one or two power supplies, the detector to receive the substantially noise free differential current signal, to detect a noise signal on the one power supply or the two power supplies, and to generate a high noise detection signal to indicate detection of the noise signal;
   wherein the detector comprises:
   a PMOS current mirror to receive the substantially noise free differential current signal;
   an NMOS current mirror to receive a substantially noise free complementary current signal;
   a first resistor coupled to the PMOS current mirror;

a second resistor coupled to the NMOS current mirror;
a comparator coupled to the current mirrors and the resistors;
two resistor-capacitor high-pass filters, each coupled to one of the two comparator's inputs;
one or more capacitors, each of the one or more capacitors coupled to at least one of the two power supplies and to a resistor-capacitor high-pass filter via a NMOS switch;
a filter load, comprising selectable low-pass filter paths, each path comprising pass-gates and a resistor-capacitor low-pass filter, the filter load is coupled to the comparator;
a Schmitt trigger coupled to the filter load, the Schmitt trigger to generate a pre-noisedetection signal;
an exclusive-OR gate coupled to the Schmitt trigger, to provide noise polarity selection;
a logic-high latch comprising a NOR gate, a NAND gate, and three inverters, to store the high noise detection signal, and to reset the high noise detection signal; and
a flip-flop register coupled to the logic-high latch to synchronize the high noise detection signal.

4. The circuit of claim 3, wherein the reference current source comprises a controllable current source.

5. A circuit comprising:
a reference current source to provide a substantially noise free differential current signal; and
a detector coupled to one or two power supplies, the detector to receive the substantially noise free differential current signal, to detect a noise signal on the one power supply or the two power supplies, and to generate a high noise detection signal to indicate detection of the noise signal;
wherein the reference current source comprises:
a substantially noise free ground;
a control signal source;
a voltage reference coupled to the substantially noise free ground;
a voltage follower differential amplifier coupled to the substantially noise free ground and to the voltage reference;
a PMOS-NMOS-NMOS diode stack coupled to the voltage follower differential amplifier and to the substantially noise free ground;
Controllable NMOS current scalers coupled to the substantially noise free ground signal source, the control signal source, and the diode stack, and a PMOS transistor load, to provide a calibration voltage for controllable PMOS current scalers;
NMOS current mirrors coupled to the controllable PMOS current scalers and the substantially noise free ground to provide the substantially noise free reference current signal; and
PMOS current mirrors coupled to a NMOS current mirrors, and the substantially noise free ground, to provide the substantially noise free complementary reference current signal.

6. The circuit of claim 5, wherein the voltage reference comprises a bandgap voltage reference.

7. A circuit comprising:
a plurality of reference current sources formed on a substrate, each of the plurality of reference current sources to provide a substantially noise free differential current signal; and
a plurality of detectors formed on the substrate, each of the plurality of detectors coupled to one or two power supplies, each of the plurality of detectors to receive the substantially noise free differential current signal and to detect a noise signal on the one or two power supplies and to generate a noise detection signal to indicate detection of the noise signal.

8. The circuit of claim 7, wherein the substrate comprises silicon.

9. The circuit of claim 8, wherein each of the plurality of detectors comprises a comparator.

10. The circuit of claim 9, wherein each of the comparators comprises complementary metal-oxide semiconductor field-effect transistors.

11. The circuit of claim 7, wherein the substrate comprises gallium arsenide.

12. The circuit of claim 8, wherein each of the plurality of reference current sources comprises a pair of complementary current sources.

13. The circuit of claim 7, wherein the substrate comprises silicon and germanium.

14. The circuit of claim 13, wherein each of the plurality of reference current sources comprises a controllable current source.

15. The circuit of claim 7, wherein the substrate comprises a processor.

16. The circuit of claim 15, wherein the processor comprises a very-long instruction word processor.

17. A method comprising:
producing a substantially noise free differential current signal, wherein a first current signal of the substantially noise free differential current signal is provided by a PMOS current mirror, and a second current signal of the substantially noise free differential current signal is provided by an NMOS current mirror;
detecting one or two power supply signals;
processing the substantially noise free differential current signal and the one or two power supply signals to detect a noise signal in the one or two power supply signals; and
generating a noise detection signal in response to detection of the noise signal.

18. The method of claim 17, wherein processing the substantially noise free current signal and the one or two power supply signals to detect the noise signal in the one or two power supply signals comprises:
comparing the one or two power supply signals to the substantially noise free current signal.

19. A method comprising:
receiving a substantially noise free current signal;
receiving one or two power supply signals;
processing the substantially noise free current signal and the one or two power supply signals to detect a noise signal in the one or two power supply signals; and
generating a noise detection signal in response to detection of the noise signal;
wherein receiving the substantially noise free current signal comprises:
receiving a pair of complementary current signals.

20. The method of claim 19, wherein receiving the one or two power supply signals comprises:
receiving two voltage signals having different polarities.

21. The method of claim 19, wherein processing the substantially noise free current signal and the one or two power supply signals to detect the noise signal in the one or two power supply signals comprises:
comparing the one or two power supply signals to the substantially noise free current signal.

22. The method of claim 19, wherein generating the noise detection signal in response to detection of the noise signal comprises:

generating a digital signal in response to detection of the noise signal.

23. The method of claim 19, further comprising:

setting a calibration potential level; and setting a noise-detection threshold level.

* * * * *

UNITED STATES PATENT AND TRADEMARK OFFICE
CERTIFICATE OF CORRECTION

PATENT NO. : 7,157,947 B2 Page 1 of 1
APPLICATION NO. : 10/731393
DATED : January 2, 2007
INVENTOR(S) : Chansungsan et al.

It is certified that error appears in the above-identified patent and that said Letters Patent is hereby corrected as shown below:

In column 7, line 15, in Claim 3, delete "pre-noisedetection" and insert -- pre-noise detection --, therefor.

Signed and Sealed this

Twenty-second Day of May, 2007

JON W. DUDAS
*Director of the United States Patent and Trademark Office*